United States Patent
Ou et al.

(10) Patent No.: US 8,293,382 B2
(45) Date of Patent: Oct. 23, 2012

(54) SEMICONDUCTOR LIGHT-EMITTING DEVICE HAVING STACKED TRANSPARENT ELECTRODES

(75) Inventors: Chen Ou, Hsinchu (TW); Chen-Ke Hsu, Hsinchu (TW)

(73) Assignee: Epistar Corporation (TW)

( * ) Notice: Subject to any disclaimer, the term of this patent is extended or adjusted under 35 U.S.C. 154(b) by 1018 days.

(21) Appl. No.: 12/078,375

(22) Filed: Mar. 31, 2008

(65) Prior Publication Data

US 2008/0241526 A1 Oct. 2, 2008

(30) Foreign Application Priority Data

Mar. 30, 2007 (TW) ................. 96111705 A

(51) Int. Cl.
*B32B 9/00* (2006.01)

(52) U.S. Cl. ........ 428/690; 428/336; 428/689; 257/198; 257/103; 257/96; 257/E33.05; 257/E33.068; 362/600; 362/612; 362/545; 362/800

(58) Field of Classification Search ............. 257/198, 257/103, 96, E33.05, E33.068; 362/600, 362/612, 545, 800; 428/336, 690
See application file for complete search history.

(56) References Cited

U.S. PATENT DOCUMENTS

| | | | |
|---|---|---|---|
| 7,154,127 B2 * | 12/2006 | Shakuda et al. | ................. 257/99 |
| 2005/0212002 A1 | 9/2005 | Sanga et al. | |
| 2006/0054921 A1 | 3/2006 | Murakami et al. | |
| 2006/0163604 A1 | 7/2006 | Shin et al. | |
| 2008/0073658 A1 * | 3/2008 | Wirth | ............................. 257/96 |

FOREIGN PATENT DOCUMENTS

| CN | 1602124 A | 3/2005 |
|---|---|---|
| KR | 10-2006-0089569 | 8/2006 |

OTHER PUBLICATIONS

The American Heritage Dictionary of the English Language, Fourth Edition, 2000, Houghton Mifflin Company, www.thefreedictionary.com/reflectivity, www.thefreedictionary.com/transmittance.*
Weisstein, Eric W., "Eric Weisstein's World of Physics—Electrical Conductance", 1996-2007, scienceworld.wolfram.com/physics/electricalconductance.html.*

* cited by examiner

*Primary Examiner* — Jennifer McNeil
*Assistant Examiner* — Clarisa M Carrizales
(74) *Attorney, Agent, or Firm* — Bacon & Thomas, PLLC

(57) ABSTRACT

The luminous element includes a luminescence lamination, a second transparent oxidative conducting layer and a composite conducting layer. The composite conducting layer includes first transparent oxidative conducting layer and a metal layer. The second transparent oxidative conducting layer is positioned between the metal layer and luminescence lamination the second transparent oxidative conducting layer forms good ohmic contact with the luminous element and with metal layer. Thus, the metal layer will not be influenced by interfusion so as to maintain good light transmissivity and raise luminous efficiency of luminous element.

20 Claims, 8 Drawing Sheets

SEMICONDUCTOR LIGHT-EMITTING DEVICE HAVING STACKED TRANSPARENT ELECTRODES

TECHNICAL FIELD

The invention relates to a light-emitting device, and more particularly to a semiconductor light-emitting device having stacked transparent electrodes.

REFERENCE TO RELATED APPLICATION

This application claims the right of priority based on TW application Ser. No. 096111705, filed Mar. 30, 2007, and the content of which is hereby incorporated by reference.

DESCRIPTION OF BACKGROUND ART

An important issue arose in designing a structure of a light-emitting diode (LED) is to evenly spread current from bonding pad to p-n junction in order to reach a better light-emitting efficiency. The known technologies such as semiconductor window layer, transparent conductive oxide film, and patterned electrode, are already used to boost the current-spreading performance.

GaP window layer is usually adopted in AlGaInP series LED. GaP has an energy band gap (Eg) of 2.26 eV, and is transparent to red, orange, yellow light, and part of green light spectrum, and is an indirect band gap semiconductor, which absorbs less light in comparison with a direct band gap semiconductor. A GaP layer of a sufficient thickness such as 2 μm~30 μm exhibits an acceptable current-spreading behavior, and the thicker the GaP window layer is, the better the current-spreading performance can be achieved. However, it takes much time to grow a thicker window layer and the throughput is reduced.

The transparent conductive oxides such as ITO, CTO, and InO are also used to enhance the current-spreading performance. For instance, ITO has a 90% transmittance in the range of 500 nm~800 nm in wavelength with a resistivity of $3 \times 10^{-4}$ Ω-cm and a sheet resistance of 10Ω/□. Generally speaking, a small scale chip with an ITO layer of 0.1 μm~1 μm can acquire an acceptable current-spreading outcome. The required thickness can be formed in a short time by using the known manufacturing method such as sputtering and electron beam evaporation. However, the ITO also falls short of the current-spreading requirement in response to the increasing area of light-emitting diode chip (for example, chip size≧15× 15 mil) and the development of rectangular chip.

Patterned electrode is another way that is often used to elevate current-spreading performance. In the method, to evenly spread current from the patterned electrode to p-n junction, the electrode is arranged by outwardly extending from a connection, interdigitating p- and n-electrodes, or forming as dots, mesh or other patterns. To form a patterned electrode, extra quantity of electrode material is often needed in order to cover larger area of the upper surface of the light-emitting diode. Moreover, the material adopted in the patterned electrode is usually an opaque metal, and consequently the light-emitting efficiency is greatly degraded.

SUMMARY OF THE DISCLOSURE

The application provides a semiconductor light-emitting device able to spread current to increase the light-emitting efficiency.

In one embodiment in accordance with the invention, the disclosed semiconductor light-emitting device includes a substrate; a semiconductor epitaxial layer over the substrate and having an outer surface distant from the substrate; a first transparent conductive layer over the outer surface; and a second transparent conductive layer over a first surface of the first transparent conductive layer; wherein the area of the interface between the second and first transparent conductive layers is smaller than the total area of the first surface of the first transparent conductive layer.

Preferably, an area ratio of the surface of the second transparent conductive layer to that of the first transparent conductive layer is not greater than ½. The composition of the material of the first transparent conductive layer and the second transparent conductive layer are identical or similar. The area of the semiconductor light-emitting device is not smaller than 15×15 mil.

In several embodiments, the first transparent conductive layer covers whole or part of the outer surface. The first transparent conductive layer has a greater transmittance to light emitted from the semiconductor epitaxial layer than that of the second transparent conductive layer. The conductivity of the first transparent conductive layer is smaller than that of the second transparent conductive layer. The thickness of the first transparent conductive layer is greater than that of the second transparent conductive layer. The second transparent conductive layer comprises a plurality of electrically-connected segments.

In another embodiment, the semiconductor light-emitting device further includes a groove sunken from a surface of the semiconductor epitaxial layer to a bottom surface to expose part of at least one layer of the semiconductor epitaxial layer, and extending from a first side of the semiconductor epitaxial layer toward an opposite second side; and a second connection layer in the groove and having an extension segment over the bottom surface. In a modified embodiment, at least one of the first transparent conductive layer and the second transparent conductive layer surrounds the groove. In addition, the semiconductor light-emitting device further includes a first connection electrically connected to the second transparent conductive layer.

In a further embodiment, the semiconductor epitaxial layer includes a first type semiconductor layer; a second type semiconductor layer; and a light-emitting layer between the first type semiconductor and the second type semiconductor.

DETAILED DESCRIPTION OF PREFERRED EMBODIMENTS

The embodiments of the invention are described in accompany with drawings. The term "layer" used in this specification is meant to be a single layer, or two or more layers having identical or different composition materials. The layers can be directly or indirectly connected.

The First Embodiment

Figure 1A:
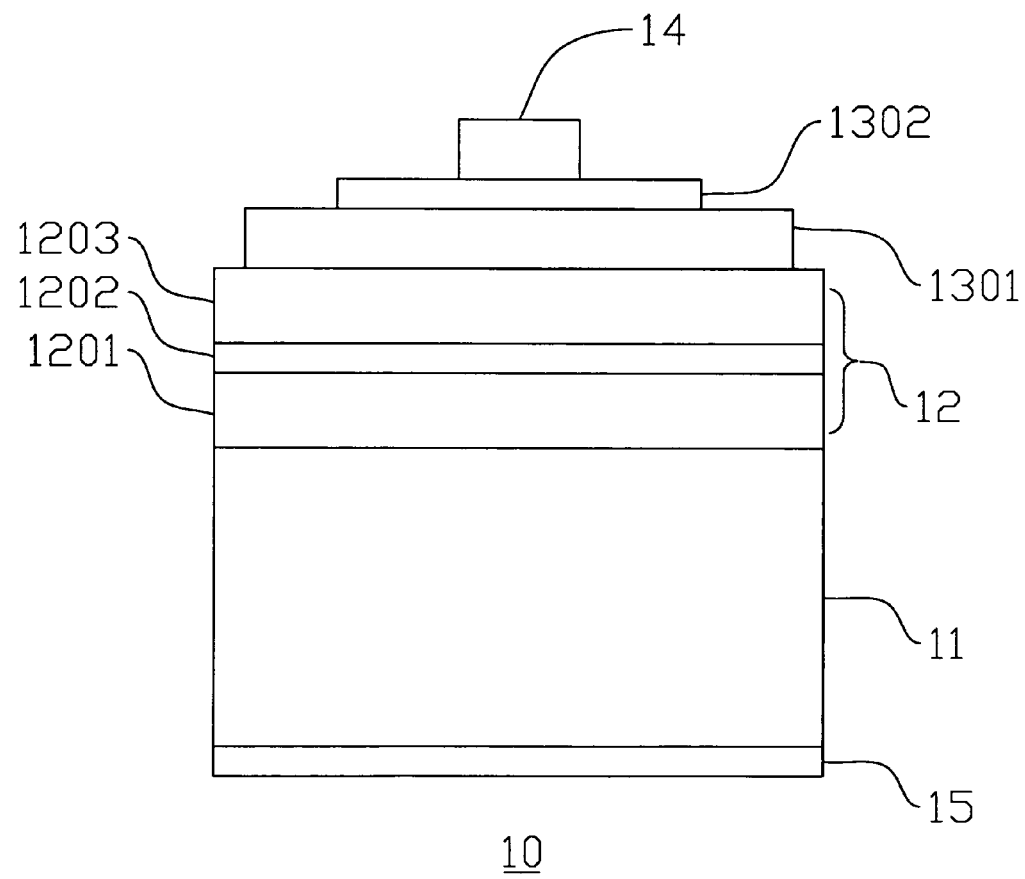
FIG. 1A illustrates a cross section of a light-emitting diode in accordance with an embodiment of present invention.

As shown in FIG. 1A, the semiconductor light-emitting device 10 includes an electrode 15, a substrate 11, a semiconductor epitaxial layer 12, a first transparent conductive layer 1301, a second transparent conductive layer 1302, and a connection 14. The semiconductor epitaxial 12 includes at least a first type semiconductor layer 1201, a second type semiconductor layer 1203, and a light-emitting layer 1202 between the first type semiconductor layer 1201 and the second type semiconductor 1203. The first type semiconductor layer 1201 and the second type semiconductor layer 1203 have different conductivities, for example, the conductivities are selected from at least two of p-type, n-type, and i-type. In a double heterostructure (DH), the energy band gaps of the first type semiconductor layer 1201 and the second type semiconductor layer 1203 are greater than that of light-emitting layer 1202. When a bias voltage is applied to the semiconductor epitaxial layer 12, the electrons and holes recombine in the region and/or neighborhood of the light-emitting layer, and then light is radiated.

In present invention, the first transparent conductive layer 1301 and the second transparent conductive layer 1302 are sequentially formed on the semiconductor epitaxial layer 12. The first transparent conductive layer 1301 covers whole or part of the upper surface of the semiconductor epitaxial layer 12. The second transparent conductive layer 1302 covers part of the upper surface of the first transparent conductive layer 1301, i.e. the second transparent conductive layer 1302 is smaller in area than the first transparent conductive layer 1301. In present embodiment, only two layers are displayed, however, a transparent conductive layer having more than two area-shrinking layers may be adopted in present invention.

In one preferable embodiment, the first transparent conductive layer 1301 and the second transparent conductive layer 1302 are made of the same material but with different electrical and/or optical properties, and the compositions or proportions of elements in the material can be different from each other, therefore, the resistivity and the transmittance of the first transparent conductive layer 1301 are greater than those of the second transparent conductive layer 1302.

The second transparent conductive layer 1302 has a resistivity effective enough to spread current to the underneath larger-area first transparent conductive layer 1301. The sheet resistance or the resistivity of the first transparent conductive layer 1301 is greater than that of the second transparent conductive layer 1302. One function of the second transparent conductive layer 1302 is to make current flow towards the distant connection 14 under a suitable transmittance range. Under the prerequisite, the material composition, thickness, and the layout of the second transparent conductive layer 1302 can be adapted to the requirement.

Current flows into the second transparent conductive layer 1302 through the connection 14, and flows into the first transparent conductive layer 1301 through the second transparent conductive layer 1302, and then flows into the semiconductor epitaxial layer 12 through the first transparent conductive layer 1301. With the combination of the two transparent conductive layers, current can flow outwardly, and the current crowding effect is further alleviated. Due to a more complete photoelectric transformation in the light-emitting layer 1202, one can obtain a more efficient light-emitting region.

Figure 1B:
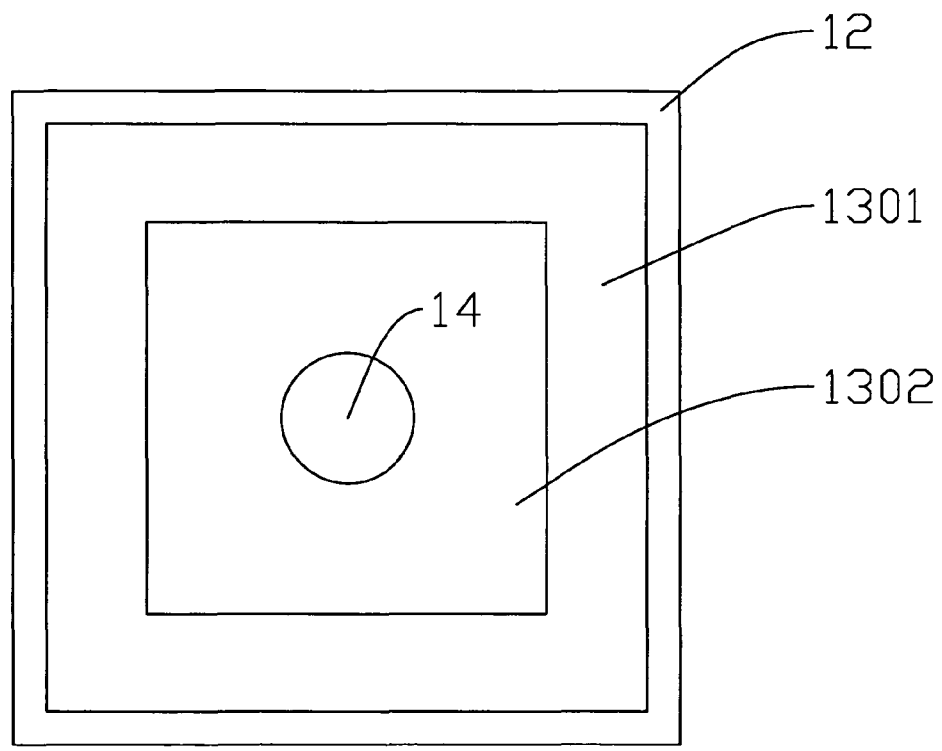
FIG. 1B illustrates a top view of the light-emitting diode of FIG. 1A.

FIG. 1B illustrates a top view of the semiconductor light-emitting device 10 of FIG. 1A. In the drawing, the areas of the connection 14, the second transparent conductive layer 1302, and the first transparent conductive layer 1301 are gradually increased. With an appropriate arrangement of the thickness, sheet resistance, and/or the resistivity, current from the connection 14 gradually flows outwards and downwards, and spreads into the light-emitting layer 1202.

In one embodiment, both of the first transparent conductive layer 1301 and the second transparent conductive layer 1302 are made by ITO, while the proportions of at least one of In, O, and Sn in the two layers are at different levels, or the two ITO layers are made by different process conditions, for example, the first transparent conductive layer 1301 is made by sputtering, and the second transparent conductive layer 1302 is made by electron beam evaporation, or vice versa. Preferably, the first transparent conductive layer 1301 is made by ITO having a higher transmittance such as above 90%, 80%, 70%, or 60%, and the second transparent conductive layer 1302 is made by ITO having a lower transmittance such as below 50% and a lower resistivity. With the condition, one can obtain a light-emitting device having appropriate optical and electrical performance (such as the levels of transmittance and resistivity).

In one embodiment, the first transparent conductive layer 1301 and the second transparent conductive layer 1302 can be also made by ITO and metal such as Ni/Au or Au respectively. The metal is better to have a thickness between 0.005 μm~0.2 μm in order to sustain both of the transmittance and the resistivity in appropriate levels. In another embodiment, the thickness of the second transparent conductive layer 1302 is smaller than the surface roughness Ra of the first transparent conductive layer 1301. However, within the manufacturing tolerance, the thickness of the second transparent conductive layer 1302 can be greater than the surface roughness Ra of the first transparent conductive layer 1301. The thin metal has a smaller resistivity than that of ITO, and therefore, can provide help in spreading current within ITO layer and obstructs less quantity of light.

In one embodiment, part or whole of at least one of the first transparent conductive layer 1301 and the second transparent conductive layer 1302 is transparent or has a more than 50% transmittance to light from light-emitting layer 1202, and the first transparent conductive layer 1301 has a higher transmittance than that of the second transparent conductive layer 1302. An individual transparent conductive layer may also be composed of two or more portions having different transmittances. The second transparent conductive layer 1302 has a lower resistivity to reach a better current-spreading performance, and should absorb light from the light-emitting layer 1202 as less as possible. In another embodiment, the thickness of the first transparent conductive layer 1301, which has a higher transmittance, is greater than that of the second transparent conductive layer 1302, which has a lower resistivity. But the invention is not limited to aforementioned cases; the thickness arrangement of the two transparent conductive layers is dependent upon the characteristic of the adopted material.

In the foregoing embodiments, the material of the substrate 11 includes, but not limited to, SiC, GaAs, AlGaAs, GaAsP, ZnSe, III-nitride (e.g. GaN), sapphire, Si, and glass. The materials of the first type semiconductor layer 1201 and the second type semiconductor 1203 include, but not limited to, AlGaInP series and III-nitride series. The structure of the light-emitting layer 1202 includes, but not limited to, single heterostructure (SH), double heterostructure (DH), double-side double heterostructure (DDH), single quantum well (SQW), and multi-quantum well (MQW).

The material of the first transparent conductive layer 1301 includes, but not limited to, ITO, IZO, ZnO, CTO, $In_2O_3$, $SnO_2$, MgO, CdO, and other transparent oxide. The material of the second transparent conductive layer 1302 includes, but not limited to, ITO, IZO, ZnO, CTO, $In_2O_3$, $SnO_2$, MgO, CdO, and other transparent oxide. The material of the second transparent conductive layer 1302 includes, but not limited to, Au, Ni, Ti, In, Pt, Al, Cr, Rh, Ir, Co, Zr, Hf, V, Nb, an alloy or a stack of aforementioned materials, and other metal with acceptable optical and electrical properties.

The Second Embodiment

Figure 2:
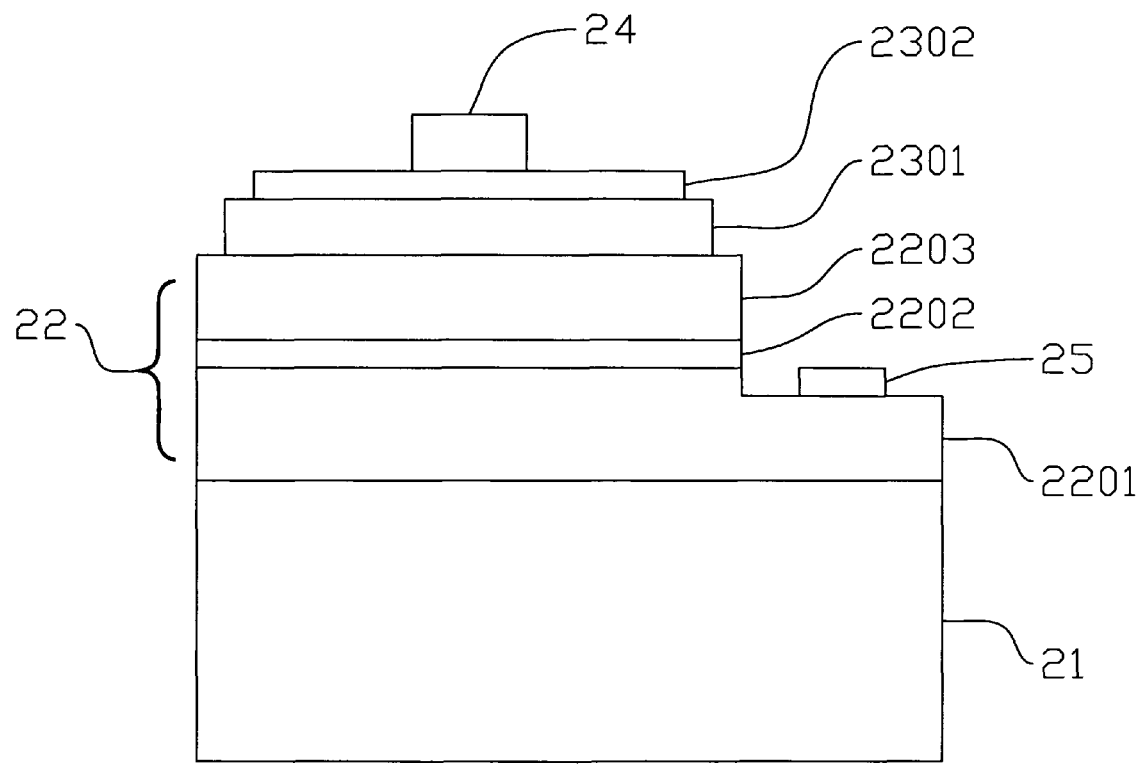
FIG. 2 illustrates a cross section of a light-emitting diode in accordance with another embodiment of present invention.

Refer to FIG. 2, the semiconductor light-emitting device 20, in accordance with another embodiment of present invention, includes a substrate 21, a semiconductor epitaxial layer 22, a first transparent conductive layer 2301, a second transparent conductive layer 2302, a first connection 24, and a second connection 25, wherein the first and second connections are positioned on the same side of the substrate 21. The semiconductor epitaxial layer 22 includes at least a first type semiconductor layer 2201, a second type semiconductor layer 2203, and a light-emitting layer 2202 between the first type semiconductor layer 2201 and the second type semiconductor layer 2203.

In the embodiment, current injected from the first connection 24 firstly flows into the second transparent conductive layer 2302, and then the first transparent conductive layer 2301 through the second transparent conductive layer 2302, and further flows into the semiconductor epitaxial layer 22 through the first transparent conductive layer 2301. With the combination of the two transparent conductive layers, current can flow outwardly, and light-emitting efficiency is increased.

In the embodiment, the materials used in the semiconductor light-emitting device 20, and the relation between the first transparent conductive layer 2301 and the second transparent conductive layer 2302 can refer to the description of the first embodiment. Furthermore, structures or design principles similar to those of the first transparent conductive layer 2301 and the second transparent conductive layer 2302 can also be introduced among the second connection 25 and the first type semiconductor layer 2201 to improve the current-spreading performance.

The first and second transparent conductive layers may have following modifications, however, the following embodiments are not used to limit the invention, and any suitable arrangement may be incorporated with the concept of the invention.

The Third Embodiment

Figure 3A:
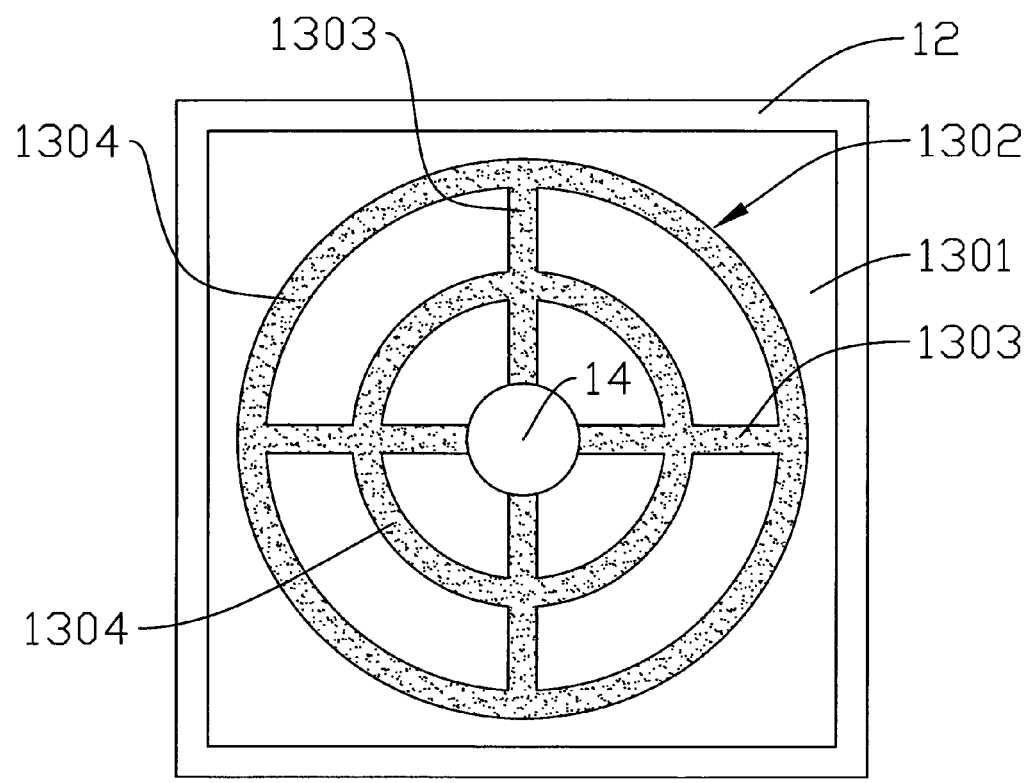
FIGS. 3A and 3B illustrate layouts of the transparent conductive layer in accordance with an embodiment of present invention.
Figure 3B:
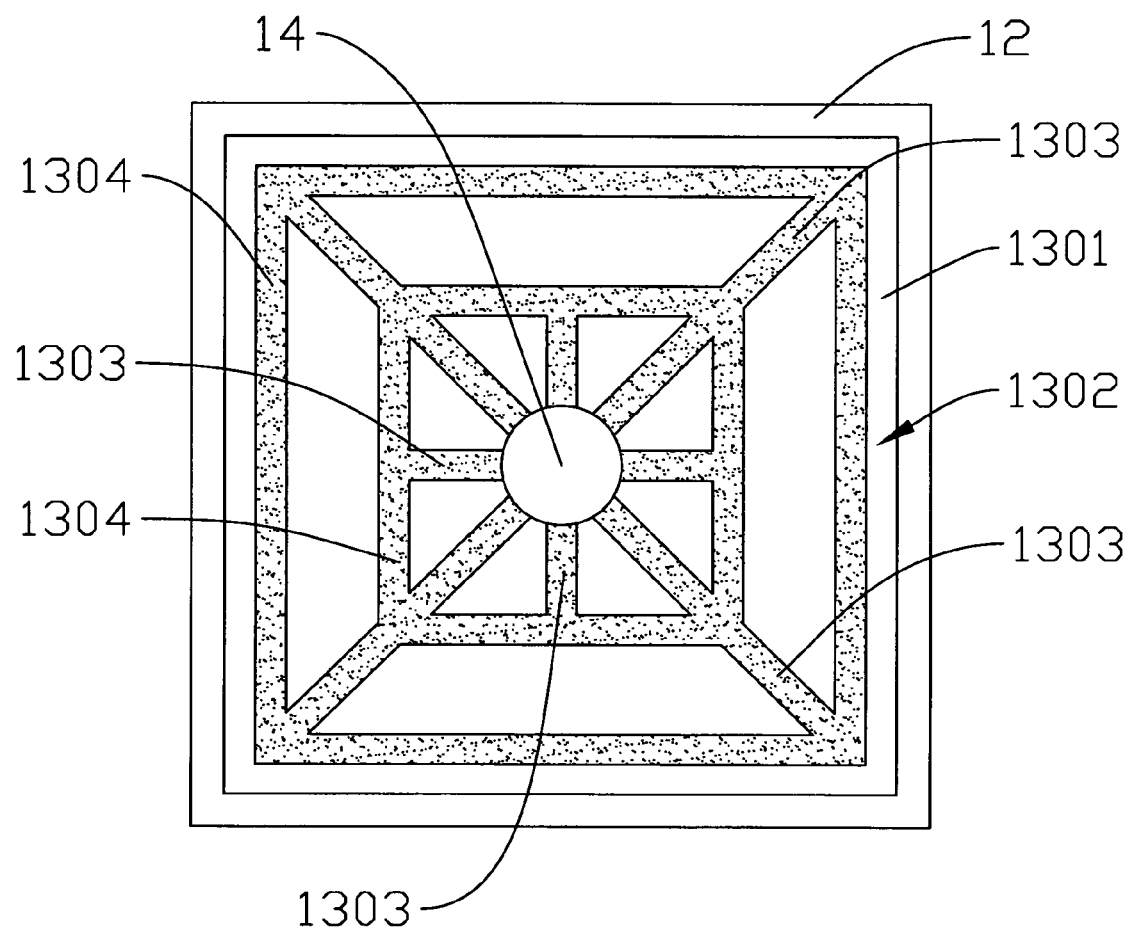

FIGS. 3A and 3B illustrate top views of the first transparent conductive layer 1301 and the second transparent conductive layer 1302 of the semiconductor light-emitting device 10. In the two views, the second transparent conductive layer 1302 is formed on the first transparent conductive layer 1301, and has an area smaller than that of the first transparent conductive layer 1301.

In present embodiment, the second transparent conductive layer 1302 has a surrounding segment 1304 and a cross segment 1303. As shown in FIG. 3A, the surrounding segment 1304 includes two circular segments surrounding the connection 14. The cross segment 1303 extends outwardly from the connection 14 and passes through the first circular segment near the connection 14. Those segments are electrically connected with each other, but not limited to a physical connection. The current from the connection 14 flows through the cross segment 1303 and then spreads outwards into the first and second circular segments. The current further spreads to farther regions after passing through the two circular segments.

In present embodiment, the surrounding segment 1304 and cross segment 1303 are not limited to the quantity described in the specification or shown in the drawings. The surrounding segment may also be substituted by segments in polygon shapes, such as triangle, quadrangle, pentagon, and hexagon. As shown in FIG. 3B, The surrounding segment 1304 includes two quadrangles. The cross segment 1303 can penetrate or not the surrounding segment 1304. The surrounding segment 1304 can be arranged in a radial symmetry or bilateral symmetry with respect to the connection 14. The connection 14 may also be in any position of the surrounding segment 1304.

The cross segment and surrounding segment need to be have a predetermined width in order to spread current and not to absorb too much light. The widths of the surrounding segment 1304 and the cross segment 1303 are respectively between 0.1 μm and 50 μm, preferably, less than 20 μm. The thicknesses of the two segments depend on the adopted materials. For metallic material, the thickness is between 0.001 μm and 1 μm, preferably, between 0.005 μm and 0.05 μm, in order to sustain an appropriate transmittance. As to the transparent oxide, e.g. ITO, the segment may be thicker.

The present embodiment is only illustrated by, but not limited to, the semiconductor light-emitting device 10 of FIG. 1A. The aforementioned arrangements of the transparent conductive layer can be applied to one or both of the first transparent conductive layer 2301 and the second transparent conductive layer 2302 of the semiconductor light-emitting device shown in FIG. 2

The Fourth Embodiment

Figure 4A:
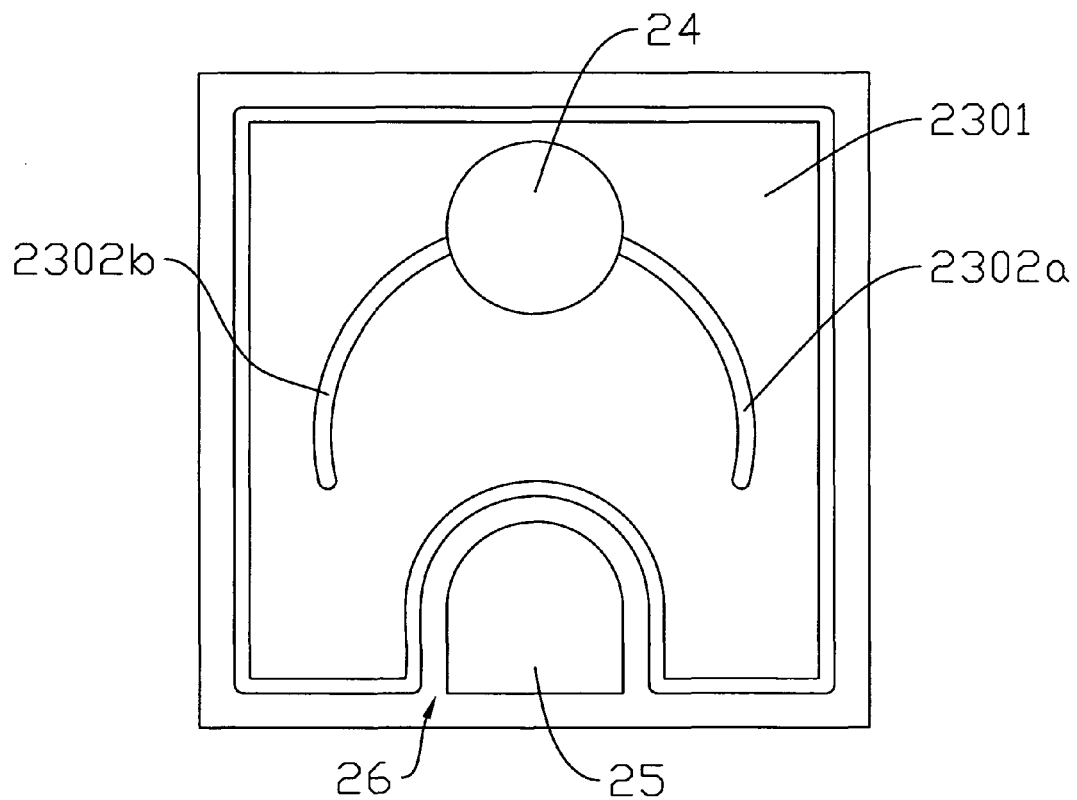
FIGS. 4A and 4B illustrate layouts of the transparent conductive layer in accordance with another embodiment of present invention.

As shown in FIG. 4A, two current-spreading segments 2302a and 2302b are positioned on the first transparent conductive layer 2301, and respectively extend outwards from the first connection 24 to the direction of the second connection 25. In the drawing, the current-spreading segments 2302a and 2302b are formed in a curve, like a U-shape. However, the current-spreading segments 2302a and 2302b may also be formed in a straight line, a curve, or the combination thereof. The current-spreading segments 2302a and 2302b preferably approach the boundary of the first transparent conductive layer 2301 in order to spread current to farther region.

The second connection 25 is located on a bottom surface of a groove 26. The bottom surface of the groove 26 and the first connection 24 are respectively on the opposite sides of the light-emitting layer 2202 to constitute an electrical path. The groove 26 is formed by etching from any position of the semiconductor epitaxial layer to exceed the depth of the light-emitting layer. The etching process is performed by chemical or physical etching. Therefore, the groove 26 is sunken from a surface of the first type second type semiconductor layer 2203 to the first type semiconductor layer 2201 to expose the first type semiconductor layer 2201, and extending from a first side of the semiconductor epitaxial layer 12 toward an opposite second side.

Figure 4B:
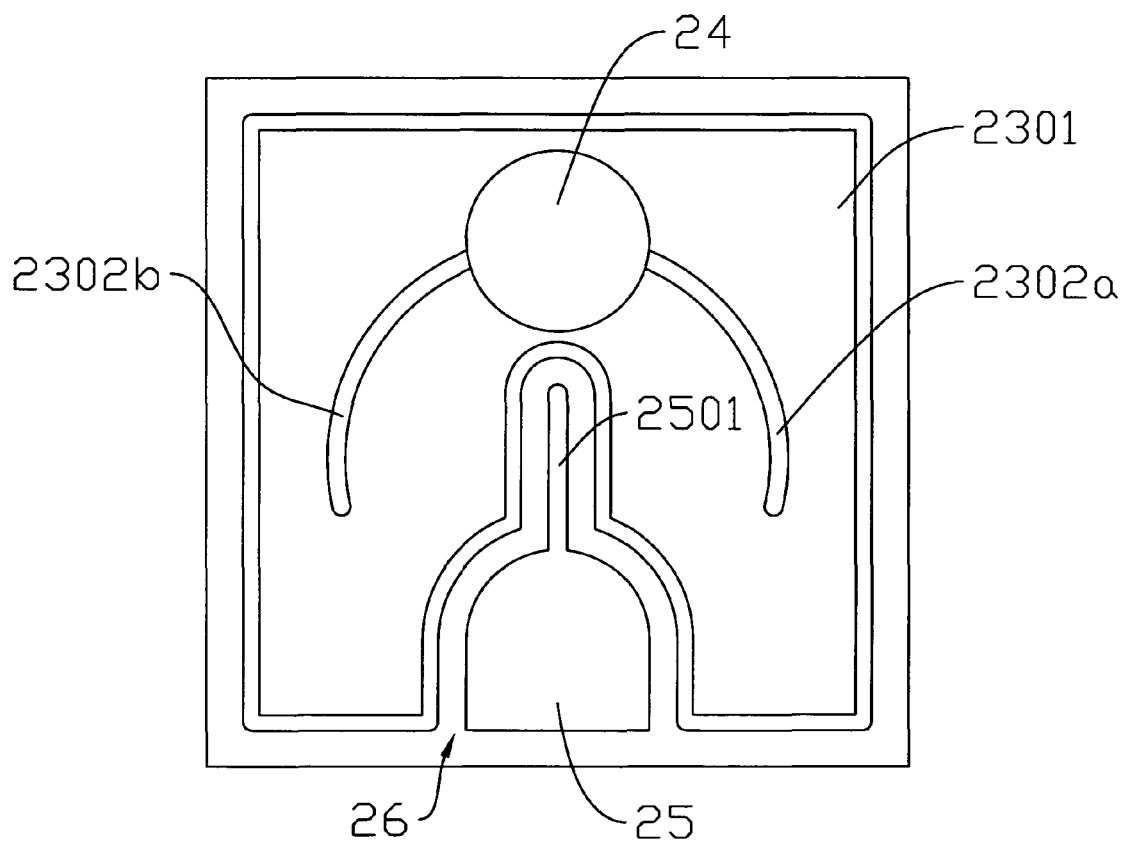

A modification of the present embodiment is shown in FIG. 4B. The groove 26 is extended to the direction of the first connection 24. An extension segment 2501 is formed in the groove 26, and extends from the second connection 25 to the direction of the first connection 24. The disposition of the current-spreading segments 2302a and 2302b are shown in FIG. 4A. The current can evenly spread in the region between the first and second connections by the assistance of the extension segment 2501, and accordingly more active light-emitting zones are introduced and the light-emitting efficiency is improved.

In present embodiment, the covering area of the segment depends on the size of the semiconductor light-emitting device. The distance between the closest neighboring individual segments is between 1 μm and 500 μm. The thickness of the segment is between 0.1 μm and 50 μm. The thickness of metallic segment is between 0.001 μm and 1 μm, preferably, between 0.005 μm and 0.05 μm; the thickness of ITO segment is larger, e.g. 0.6 μm or above.

The Fifth Embodiment

Figure 5:
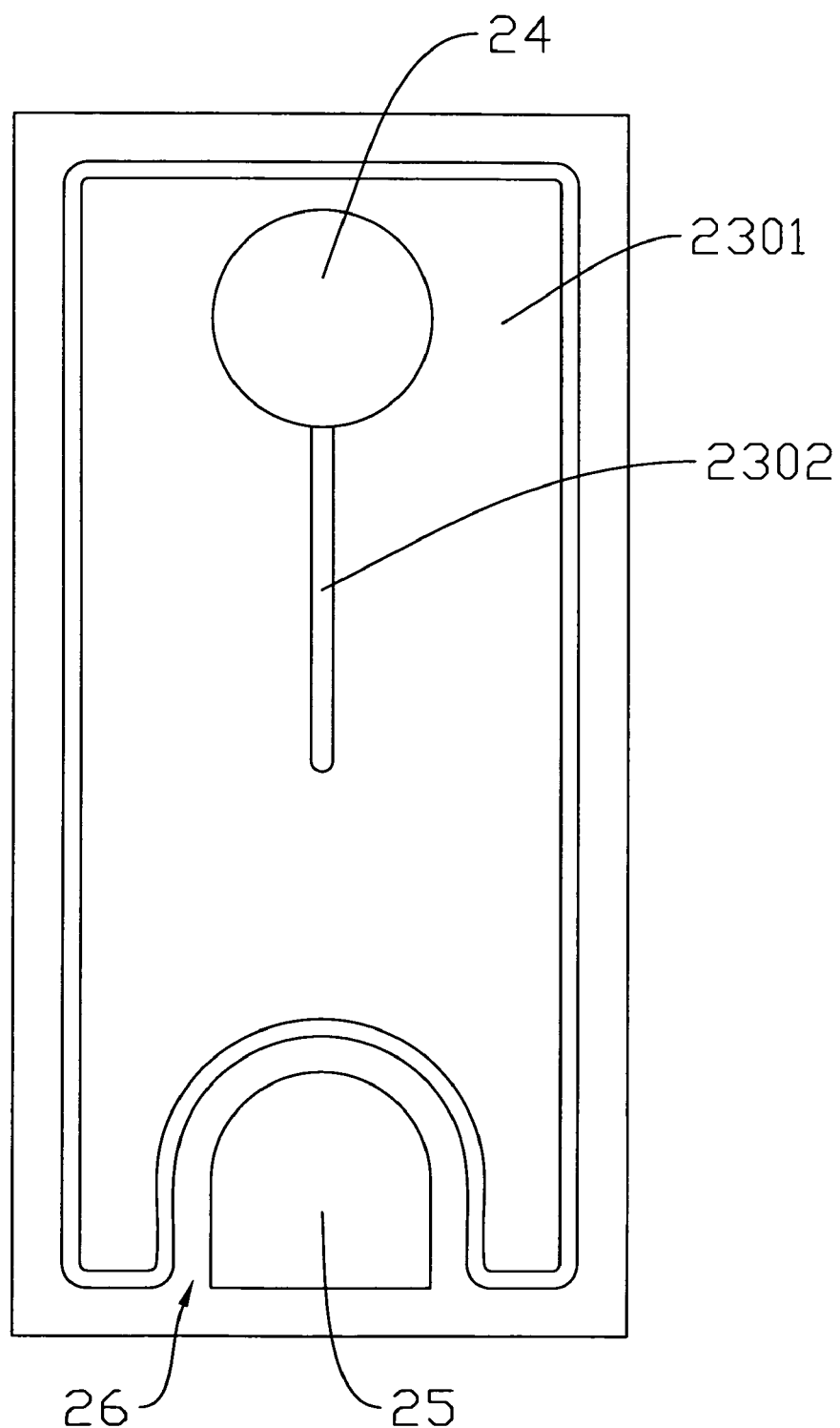
FIG. 5 illustrates a layout of the transparent conductive layer in accordance with a further embodiment of present invention.

As shown in FIG. 5, the current-spreading segment 2302 is located on the first transparent conductive layer 2301, and extends outwards from the first connection 24 to the direction of the second connection 25. In the drawing, the current-spreading segment is illustrated as a straight line, but a curve, a zigzag, or the combination thereof can also be adopted herein. Specifically, from the top view, the semiconductor light-emitting device is in a rectangular shape with a ratio of length to width in 1.1~3, preferably more than 1.5. The detailed description of groove 26 can be referred to the aforementioned embodiments.

The foregoing description has been directed to the specific embodiments of this invention. It will be apparent; however, that other variations and modifications may be made to the embodiments without escaping the spirit and scope of the invention.

What is claimed is:
1. A semiconductor light-emitting device comprising:
a substrate;
a semiconductor epitaxial layer over the substrate and having an outer surface distant from the substrate;
a first transparent conductive layer over the outer surface of the epitaxial layer and having a first surface area;
a second transparent conductive layer over the first transparent conductive layer and having a second surface area; and
a first connection over the second transparent conductive layer;
wherein at least one of the optical and electrical properties of the second transparent conductive layer is different from that of the first transparent conductive layer, and wherein the area of the second transparent conductive layer is larger than the area of the first connection and smaller than the area of the first transparent conductive layers, and wherein the second transparent conductive layer is a single layer.

2. The semiconductor light-emitting device of claim 1, wherein the first transparent conductive layer substantially overlays the whole area of the outer surface of the semiconductor epitaxial layer.

3. The semiconductor light-emitting device of claim 1, wherein the first transparent conductive layer has a greater transmittance to light emitted from the semiconductor epitaxial layer than that of the second transparent conductive layer.

4. The semiconductor light-emitting device of claim 1, wherein a conductivity of the first transparent conductive layer is smaller than that of the second transparent conductive layer.

5. The semiconductor light-emitting device of claim 1, wherein a thickness of the first transparent conductive layer is greater than that of the second transparent conductive layer.

6. The semiconductor light-emitting device of claim 1, wherein the second transparent conductive layer comprises a plurality of electrically-connected segments.

7. The semiconductor light-emitting device of claim 1, wherein a material of one or both of the first transparent conductive layer is selected from the group consisting of ITO, IZO, ZnO, CTO, $In_2O_3$, $SnO_2$, MgO, and CdO.

8. The semiconductor light-emitting device of claim 1, wherein a material of the second transparent conductive layer is selected from the group consisting of Al, Au, Cr, In, Ir, Ni, Pd, Pt, Rh, Sn, Ti, Zr, Hf, V, NB, and the alloy.

9. The semiconductor light-emitting device of claim 1, wherein the area ratio of the area of the second surface of the second transparent conductive layer to the area of the first surface of the first transparent conductive layer is not greater than ½.

10. The semiconductor light-emitting device of claim 1, wherein the second transparent conductive layer is a metal layer or a metal stack layer and has a thickness of 0.001 μm~1 μm.

11. The semiconductor light-emitting device of claim 1, wherein a thickness of the second transparent conductive layer is smaller than a surface roughness of the first transparent conductive layer.

12. The semiconductor light-emitting device of claim 1, wherein the second transparent conductive layer comprises a segment having a width not greater than 50 μm.

13. The semiconductor light-emitting device of claim 1, wherein the first transparent conductive layer and the second transparent conductive layer comprises an identical main material.

14. The semiconductor light-emitting device of claim 1, wherein the semiconductor light-emitting device is in a rectangular shape.

15. The semiconductor light-emitting device of claim 1, wherein the second transparent conductive layer comprises a surrounding segment surrounding the connection, and a cross segment extending outwardly from the connection and passing through the surrounding segment.

16. The semiconductor light-emitting device of claim 1, wherein an area of the semiconductor light-emitting device is not smaller than 15×15 mil.

17. The semiconductor light-emitting device of claim 1, wherein the semiconductor epitaxial layer comprises:
a first type semiconductor layer;
a second type semiconductor layer; and
a light-emitting layer between the first type semiconductor layer and the second type semiconductor layer.

18. The semiconductor light-emitting device of claim 17, further comprising:

a groove sunken from a surface of the semiconductor epitaxial layer to a bottom surface to expose part of at least one layer of the semiconductor epitaxial layer, and extending from a first side of the semiconductor epitaxial layer toward an opposite second side; and a second connection layer on the groove.

19. The semiconductor light-emitting device of claim 18, further comprising an extension segment protruding outward from the second connection layer.

20. The semiconductor light-emitting device of claim 18, wherein at least one of the first transparent conductive layer and the second transparent conductive layer surrounds the groove.

* * * * *